(12) United States Patent
Armstrong et al.

(10) Patent No.: US 11,688,584 B2
(45) Date of Patent: Jun. 27, 2023

(54) PROGRAMMABLE IGNITION PROFILES FOR ENHANCED PLASMA IGNITION

(71) Applicant: Advanced Energy Industries, Inc., Fort Collins, CO (US)

(72) Inventors: Mike Armstrong, Loveland, CO (US); John Accardo, Fort Collins, CO (US); Daryl Frost, Windsor, CO (US)

(73) Assignee: Advanced Energy Industries, Inc., Denver, CO (US)

( * ) Notice: Subject to any disclaimer, the term of this patent is extended or adjusted under 35 U.S.C. 154(b) by 456 days.

(21) Appl. No.: 16/861,458

(22) Filed: Apr. 29, 2020

(65) Prior Publication Data

US 2021/0343505 A1 Nov. 4, 2021

(51) Int. Cl.
*H01J 37/32* (2006.01)
*H05H 1/46* (2006.01)

(52) U.S. Cl.
CPC .. *H01J 37/32366* (2013.01); *H01J 37/32128* (2013.01); *H01J 37/32926* (2013.01); *H05H 1/46* (2013.01)

(58) Field of Classification Search
CPC ............ H01J 37/3299; H01J 37/32926; H01J 37/32935; H01J 37/32128; H01J 37/32137; H01J 37/32366; H01J 37/32715
See application file for complete search history.

(56) References Cited

U.S. PATENT DOCUMENTS

| | | | |
|---|---|---|---|
| 5,916,455 A | 6/1999 | Kumagai | |
| 6,080,270 A | 6/2000 | Tabrez et al. | |
| 6,150,628 A | 11/2000 | Smith et al. | |
| 6,156,164 A | 12/2000 | Smolanoff et al. | |
| 6,190,512 B1 | 2/2001 | Lantsman | |
| 6,204,604 B1 | 3/2001 | Donohoe | |
| 6,268,768 B1 | 7/2001 | Blodgett | |
| 6,409,896 B2 | 6/2002 | Crocker | |
| 6,633,017 B1 | 10/2003 | Drummond et al. | |
| 7,161,818 B2 | 1/2007 | Kirchmeier et al. | |
| 7,422,664 B2 | 9/2008 | Ritchie et al. | |
| 7,666,464 B2 * | 2/2010 | Collins | H01J 37/32412 427/523 |
| 8,044,594 B2 | 10/2011 | Frost et al. | |
| 8,692,466 B2 | 4/2014 | Benzerrouk et al. | |
| 9,194,045 B2 | 11/2015 | Wu et al. | |
| 9,309,594 B2 | 4/2016 | Hoffman et al. | |
| 9,524,854 B2 | 12/2016 | Hoffman et al. | |

(Continued)

OTHER PUBLICATIONS

Sathiraju, Srinivas, "Office Action Regarding U.S. Appl. No. 16/436,601", dated Jan. 30, 2020, pp. 27, Published in: US.

(Continued)

*Primary Examiner* — Tung X Le
(74) *Attorney, Agent, or Firm* — Neugeboren O'Dowd PC

(57) ABSTRACT

Generators and methods for igniting a plasma in a plasma chamber are disclosed. The generator includes an ignition profile generator that includes a data interface configured to receive a voltage value and a time value for each of N data points and an ignition data generator configured to create an ignition profile from the N data points. The generator also includes an ignition profile datastore to store the ignition profile and a waveform generator configured to apply a waveform with the ignition profile to an output of the generator.

10 Claims, 7 Drawing Sheets

(56) References Cited

U.S. PATENT DOCUMENTS

| | | |
|---|---|---|
| 9,536,713 B2 | 1/2017 | Van Zyl et al. |
| 9,577,516 B1 | 2/2017 | Van Zyl |
| 9,578,731 B2 | 2/2017 | Van Zyl |
| 9,685,297 B2 | 6/2017 | Carter et al. |
| 9,736,920 B2 | 8/2017 | Smith et al. |
| 9,748,076 B1 | 8/2017 | Choi et al. |
| 9,756,713 B2 | 9/2017 | Liechti et al. |
| 9,767,988 B2 | 9/2017 | Brouk et al. |
| 9,807,863 B1 | 10/2017 | Van Zyl |
| 10,194,518 B2 | 1/2019 | Van Zyl |
| 10,269,540 B1 | 4/2019 | Carter et al. |
| 10,309,013 B2 * | 6/2019 | Iliopoulos ............ C23C 16/4405 |
| 10,314,156 B2 | 6/2019 | Van Zyl |
| 10,447,174 B1 | 10/2019 | Porter, Jr. |
| 11,398,370 B2 * | 7/2022 | Bhutta .............. H01L 21/32136 |
| 2004/0025791 A1 | 2/2004 | Chen et al. |
| 2010/0140231 A1 | 6/2010 | Ilic |
| 2011/0259851 A1 | 10/2011 | Brouk et al. |
| 2012/0217221 A1 | 8/2012 | Brouk et al. |
| 2012/0247441 A1 | 10/2012 | Schultz |
| 2014/0062495 A1 * | 3/2014 | Carter .................... G01N 27/06 324/459 |
| 2014/0239813 A1 | 8/2014 | Van Zyl et al. |
| 2018/0146538 A1 | 5/2018 | Van Zyl |
| 2018/0277377 A1 | 9/2018 | Eto et al. |
| 2019/0148114 A1 | 5/2019 | Wu et al. |
| 2019/0228950 A1 | 7/2019 | Funk et al. |
| 2019/0326093 A1 | 10/2019 | Gurov et al. |
| 2020/0388466 A1 | 12/2020 | Huff |

OTHER PUBLICATIONS

Rodriquez, Kari, "International Search Report and Written Opinion Regarding International Application No. PCT/US21/28441", dated Jul. 27, 2021, pp. 12, Published in: US.

Baharlou, Simin, "International Preliminary Report on Patentability Regarding International Application No. PCT/US2021/028441", dated Nov. 10, 2022 , pp. 7, Published in: CH.

* cited by examiner

| | |
|---|---|
| Ignition Profile 1 | (v1, t1), (v2, t2)...(vn, tn) |
| Ignition Profile 2 | (v1, t1), (v2, t2)...(vn, tn) |
| ⋮ | ⋮ |
| Ignition Profile l | (v1, t1), (v2, t2)...(vn, tn) |

FIG. 4

PROGRAMMABLE IGNITION PROFILES FOR ENHANCED PLASMA IGNITION

BACKGROUND

Field

The present disclosure relates generally to plasma processing. In particular, but not by way of limitation, the present disclosure relates to systems, methods and apparatuses for providing power during plasma ignition.

Background

Plasma processes are widely used in many industries, such as the semiconductor manufacturing industry. One method of generating a plasma is to drive a current through a low-pressure gas between two conducting electrodes that are positioned parallel to each other. Once certain parameters are met, the gas "breaks down" to form the plasma. For example, a plasma can be generated by applying a potential between two parallel conducting electrodes in a low-pressure atmosphere.

Plasma etching is commonly used to etch substrate material and films deposited on substrates in the electronics industry. Examples of plasma etching processes that are used to remove material from surfaces include: sputter-etching, pure chemical etching, ion energy driven etching, and ion inhibitor etching.

Plasma sputtering is a technique that is widely used for depositing films on substrates and other work pieces. Sputtering is the physical ejection of atoms from a target surface and is sometimes referred to as physical vapor deposition (PVD). In general, ions are generated and are then drawn out of the plasma and accelerated across a cathode dark space. The target surface has a lower potential than the region in which the plasma is formed. Therefore, the target surface attracts positive ions.

Positive ions move towards the target with a high velocity and then impact the target and cause atoms to physically dislodge or sputter from the target surface. The sputtered atoms then propagate to a substrate or other work piece where they deposit a film of sputtered target material.

Reactive sputtering systems inject a reactive gas or mixture of reactive gases into the sputtering system. The reactive gases react with the target material either at the target surface or in the gas phase, resulting in the deposition of new compounds. The pressure of the reactive gas can be varied to control the stoichiometry of the film. Reactive sputtering is useful for forming some types of molecular thin films.

Magnetron sputtering systems use magnetic fields that are shaped to trap and concentrate secondary electrons proximate to the target surface. The magnetic fields increase the density of electrons and, therefore, increase the plasma density in a region that is proximate to the target surface. The increased plasma density increases the sputter deposition rate.

In order for plasma to form in a plasma chamber during the creation of thin films or other applications, a power generator often creates an electric potential between a cathode and anode within the plasma chamber. This causes ignition of a processing gas into the plasma. The plasma then acts upon the cathode to create the thin film upon a substrate within the chamber.

In many plasma processing applications, consistent, repeatable ignition is desired, and in some plasma processing applications, rapid plasma ignition is desired. But plasma processes have many variables affecting ignition behavior. For example, gas pressure, chamber size, cathode material, and the type of substrate being processed can affect ignition behavior, and current plasma ignition approaches to accommodate the variations affecting plasma ignition behavior are deficient. Thus, improved systems and methodologies are needed to meet the operational aspects of plasma ignition.

SUMMARY

An aspect may be characterized as a generator for igniting a plasma in a plasma chamber. The generator includes an ignition profile generator that includes a data interface configured to receive a voltage value and a time value for each of N data points and an ignition data generator configured to create an ignition profile from the N data points. The generator also includes an ignition profile datastore to store the ignition profile and a waveform generator configured to apply a waveform with the ignition profile to an output of the generator.

Another aspect may be characterized as a generator for igniting a plasma in a plasma chamber. The generator includes a waveform generator configured to produce and apply voltage waveforms at an output of the generator and an ignition profile generator configured to identify an ignition voltage that is less than a maximum voltage of the plasma chamber, create an ignition profile based upon the ignition voltage using N data points, and store the ignition profile in an ignition profile datastore for use by the waveform generator.

Yet another aspect may be characterized as a non-transitory processor-readable medium encoded with instructions for igniting a plasma in a plasma chamber with a generator. The instructions include instructions to receive a voltage value and a time value for each of N data points, create an ignition profile from the N data points, and store the ignition profile in an ignition profile datastore. A waveform with the ignition profile is then applied to an output of the generator.

BRIEF DESCRIPTION OF THE DRAWINGS

FIG. 4 depicts structure of exemplary ignition profiles;

DETAILED DESCRIPTION

The word "exemplary" is used herein to mean "serving as an example, instance, or illustration." Any embodiment described herein as "exemplary" is not necessarily to be construed as preferred or advantageous over other embodiments.

Figure 1:
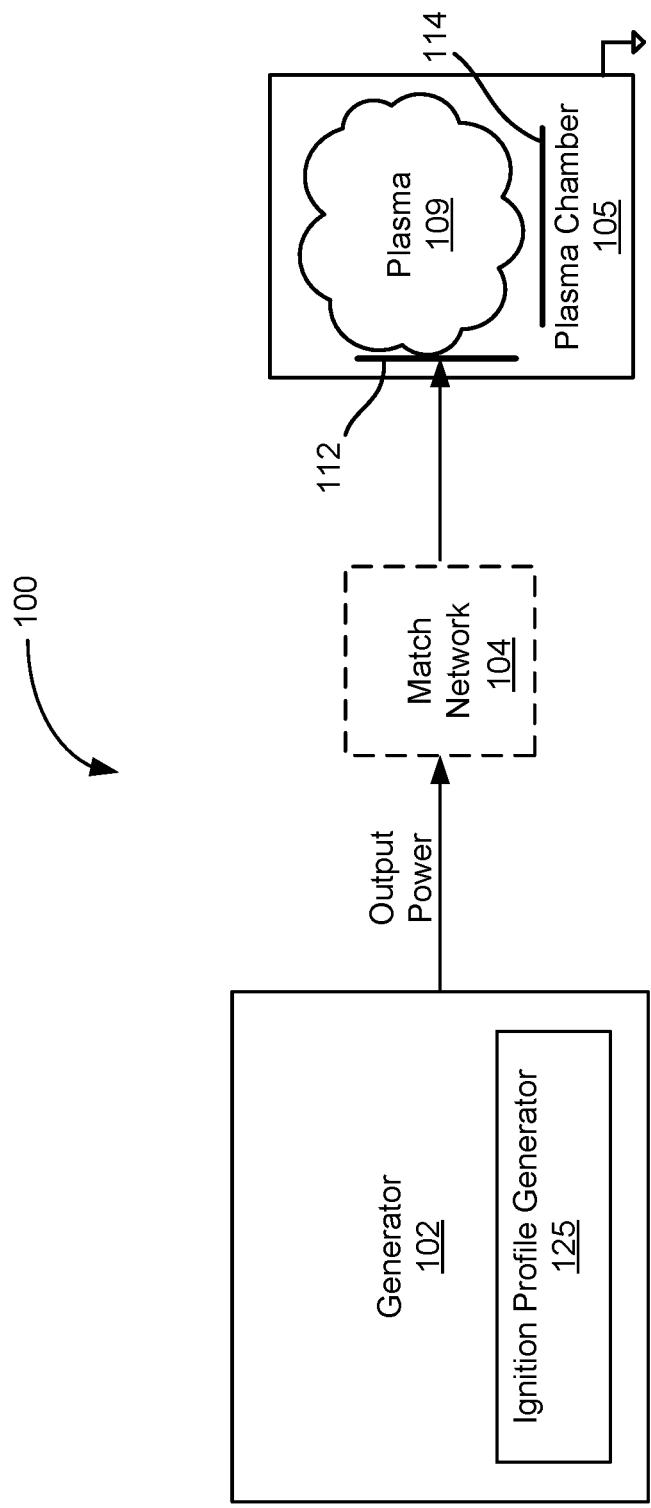
FIG. 1 is a block diagram depicting an environment in which aspects may be implemented.

Referring first to FIG. 1, shown is a block diagram depicting an exemplary plasma processing system 100 in which aspects of the present disclosure may be implemented. In FIG. 1, the plasma processing system 100 includes a generator 102, which applies power to a plasma 109 in plasma processing chamber 105 via a cathode 112. Also shown in the plasma chamber 105 is a workpiece 114. The generator 102 may be coupled directly (without a match network 104) or indirectly via one or more matching networks 104 to the cathode 112. As shown, the plasma chamber 105 may be grounded, but this is not required in many embodiments.

Although not limited to sputtering applications, several use cases disclosed herein are discussed in the context of sputtering applications. But many of the plasma ignition systems and methodologies disclosed herein are generally applicable to any type of plasma processing application. Concomitantly, the disposition and configuration of electrodes within the plasma chamber 105 may vary substantially from the configuration depicted in FIG. 1.

In the context of sputtering applications, one or more thin films may be deposited on the workpiece 114. As discussed above, sputtering is the physical ejection of material from a target surface (which may be coupled to the cathode 112) and is sometimes referred to as physical vapor deposition (PVD). Ions are drawn out of the plasma 109 and accelerated across a cathode dark space. The target surface has a lower potential than the region in which the plasma 109 is formed. Therefore, the target surface attracts positive ions. The positive ions impact the target with a high velocity to cause the target material to physically dislodge or sputter from the target surface. The sputtered material then propagates to the workpiece to create a film of sputtered target material.

As an initial step to plasma processing, the plasma 109 is ignited. As discussed, a gas pressure within the plasma chamber 105, a size of the plasma chamber 105, the target material, and the type of workpiece 114 being processed can affect ignition behavior. To address the variable, and sometimes unpredictable, behavior of the ignition of the plasma 109, the generator 102 includes an ignition profile generator 125 that generally functions to enable creation of programmable ignition profiles, which characterize voltage waveforms. And in operation, a desired ignition profile may be selected and used to ignite the plasma 109 to achieve a desired ignition to accommodate different conditions such as, without limitation, a gas pressure within the plasma chamber 105, a size of the plasma chamber 105, the target material, and the type of workpiece 114 being processed. Beneficially, the ignition profile generator enables an operator of the system to create custom tailored ignition profiles as opposed to relying on, for example, a default profile "hardwired" into the generator 102.

In prior art generators, there are typically predefined, default ignition profiles such as DC voltage levels or step functions between two voltage levels. Plasma chambers have a maximum voltage rating based on material and insulators used. Paschen's Law indicates voltages must be increased to achieve breakdown with decreasing pressure. With a trend in decreasing process pressures, the common thought (to initiate faster plasma ignition) was that voltage magnitudes had to be increased to approach the maximum applicable voltage that a plasma chamber can handle (e.g., due to insulating materials that limit the voltage). Unexpectedly, Applicant has found that voltage magnitudes need not approach a maximum voltage of a particular plasma chamber to achieve breakdown. More specifically, Applicant has found that many times there are one or more specific voltage levels associated each different plasma chamber that provides fast, repeatable ignition. Beneficially, aspects disclosed herein enable ignition profiles to be programmed so that one or more specific voltages and corresponding dwell times may be dictated by an operator of the plasma processing system 100.

Figure 2:
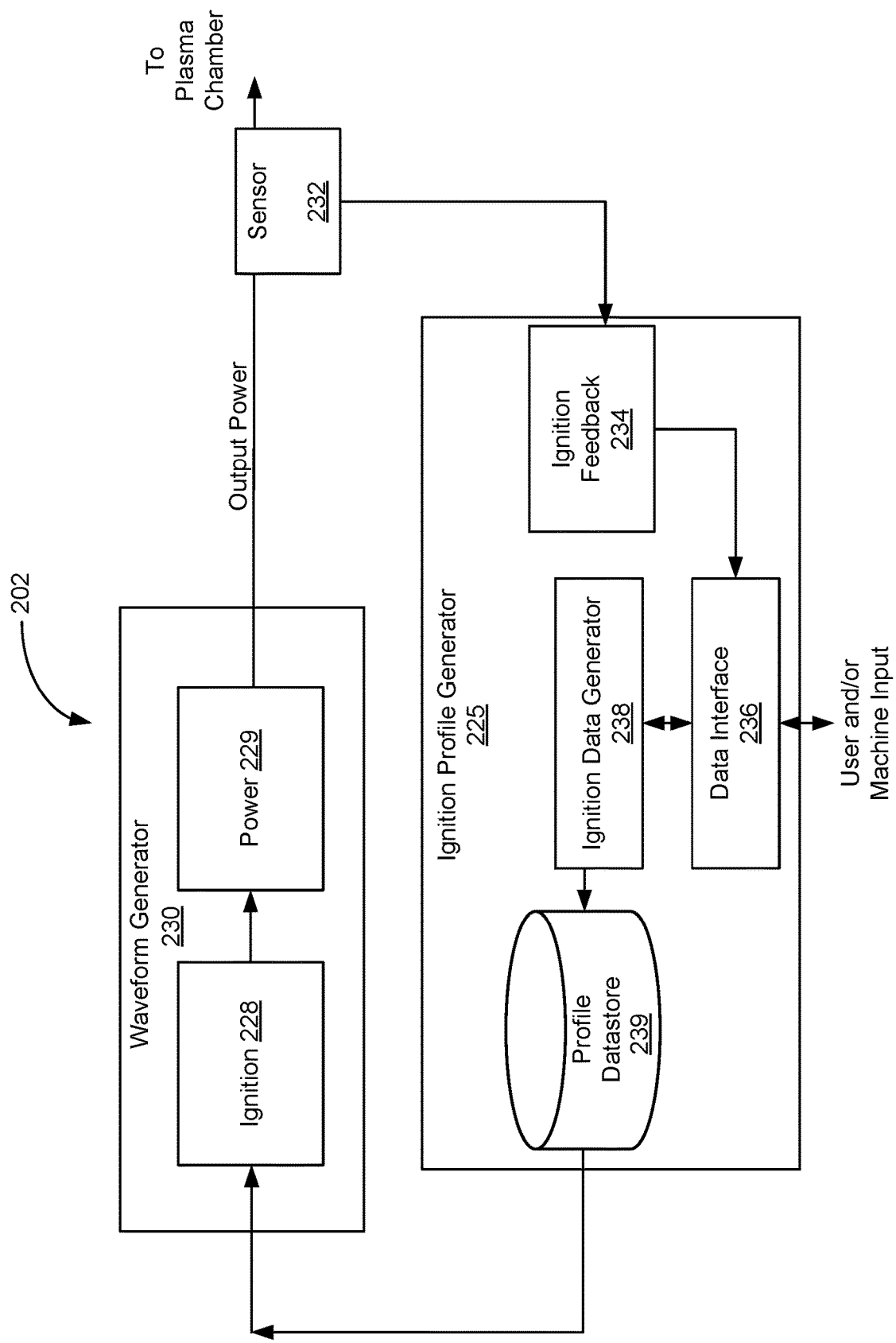
FIG. 2 is a block diagram depicting an exemplary generator that may be implemented as the generator depicted in FIG. 1.

Referring next to FIG. 2, shown is a block diagram depicting an exemplary generator 202 that may be used to implement the generator 102 depicted in FIG. 1. As shown, the generator 202 includes an ignition profile generator 225 that is coupled to a waveform generator 230 and sensor 232. As shown, the ignition profile generator 225 includes an ignition feedback module 234 that is coupled to a data interface 236 and an ignition data generator 238. A profile datastore 239 is coupled to the ignition data generator 238 and the waveform generator 230. The depiction of the components of the generator 202 in FIG. 2 is logical and it should be recognized that when implemented, the depicted functions may be realized by common constructs or further distributed.

As an example, the ignition feedback module 234, data interface 236, and ignition data generator 238 may be realized, in part, by a common central processing unit, non-volatile-memory, and random access memory that are collocated within a housing of the generator 202, and in this type of implementation, the different functional aspects of the ignition feedback module 234, data interface 236, and ignition data generator 238 may be implemented by software (processor executable instructions) that is stored in the non-volatile memory. As another example, the data interface 236 and ignition data generator 238 may be implemented by a separate central controller that is coupled to the ignition feedback module 234 and profile datastore 239 by a network connection. It should be recognized other potential distributions are certainly contemplated.

The waveform generator 230 generally functions to apply voltage waveforms that may be used to ignite the plasma 109 in the plasma chamber 105. As shown, the waveform generator 230 includes an ignition module 228 and a power module 229. It should be recognized that although a single block is depicted to represent the power module 229, the power module 229 represents a consolidation of what may be several different components using a variety of technologies.

For example, the power module 229 may be realized by well-known and/or yet-to-be-developed linear amplifier technologies to amplify a tailored source signal to produce a desired voltage waveform. Alternatively, the waveform generator 230 may be realized by well-known and/or yet-to-be developed switch-mode technologies to generate a desired waveform. In some implementations, the waveform generator may be realized by modifying an ASCENT brand power supply sold by Advanced Energy Industries of Fort Collins, Colo. In other implementations, the waveform generator 230 may be realized a described in U.S. patent application Ser. No. 16/405,251 entitled ADDITIVE SYNTHESIS OF INTERLEAVED SWITCH MODE POWER STAGES FOR MINIMAL DELAY IN SET POINT TRACKING and U.S. Pat. No. 9,807,863 entitled SWITCHING AMPLIFIER, which are incorporated herein by reference for all purposes.

The sensor 232 generally operates to provide one or more signals to the ignition feedback module 234 that are indicative of ignition-parameter values. Ignition-parameter values may include, without limitation, current, voltage, power, and phase information. Although depicted as a single block for simplicity and clarity, the sensor 232 may include several, separate sensors. The sensing technologies that may be used include voltage sensors, current sensors (current transducers), voltage-current (VI) sensors, directional couplers, and/ or optical sensors. As those of ordinary skill in the art will appreciate, the sensors may sample ignition-parameters and convert the sampled ignition parameters to a digital representation of the ignition-parameters that are provided to the ignition feedback module 234. It is also contemplated that the sensor 232 may provide analog signals that are directly utilized by the ignition feedback module 234 and the ignition feedback module 234 may produce and utilize a digital representation of the ignition-parameters.

In general, the ignition feedback module 234 provides, in response to the ignition-parameter values, insight into aspects of an environment of the plasma chamber 105 that help to generate ignition profiles. For example, the ignition feedback module 234 may generate textual and/or graphical data that represents aspects of an environment of the plasma chamber 105. As a more specific example, the ignition feedback module 234 may generate textual and/or graphical data that represents time, voltage and/or current during an ignition process. And the ignition feedback module 234 may identify an ignition voltage when ignition occurs. FIGS. 5-8, discussed further herein, provide examples of textual and graphical data that may be produced by the ignition feedback module 234. The textual and/or graphical data may be in a digital format and provided to an operator and/or machine via the data interface 236.

Figure 5:
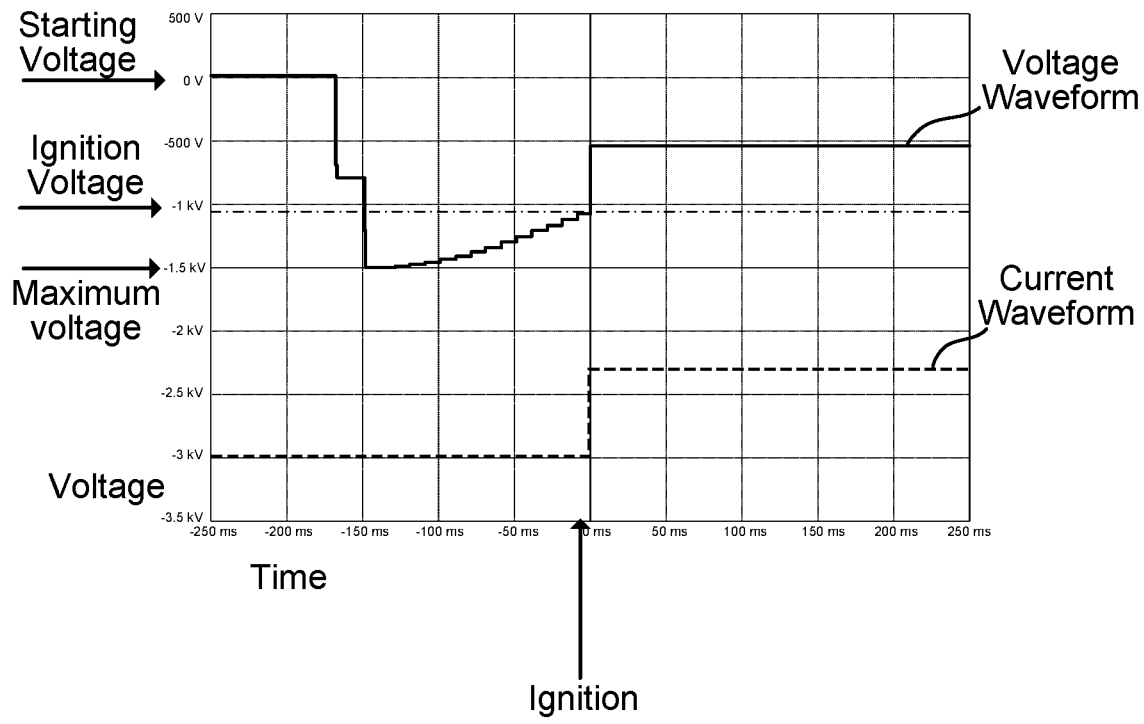
FIGS. 5-8 are graphs depicting exemplary ignition profiles.

As discussed further herein, the profile datastore 239 may include one or more test profiles that enable a range of voltages to be output from the waveform generator 230, and the ignition feedback module 234 may identify an ignition voltage when the test profile causes ignition of the plasma 109. Referring to FIG. 5, for example, shown is an exemplary test profile that depicts a voltage starting at zero volts and increasing to a maximum voltage before decreasing to an ignition voltage where ignition occurs. It should be recognized that the applied voltage depicted in FIG. 5 is a negative voltage, which is typical of a voltage applied to a cathode to trigger a plasma ignition. It should also be recognized that the test profile in FIG. 5 is exemplary only and that other ignition profiles may be used as a test profile, but FIG. 5 does show that an ignition voltage may be discovered by varying the voltage until ignition occurs.

As those of ordinary skill in the art will appreciate, ignition of the plasma 109 may be detected based upon the level of current that is provided by the generator 102 (e.g., ignition may be detected when the current reaches a threshold). The increase in current is due to the impedance (that is seen by the generator 102) dropping when gasses (that have a relatively high impedance) in the plasma chamber 105 ionize to produce the plasma 109 that has a relatively low impedance. It is also contemplated that ignition may be detected by monitoring the voltage applied to the plasma chamber 105.

In general, the data interface 236 receives and provides information to/from an operator and/or another machine. For example, the data interface 236 may include processing-logic and a display to display the textual and/or graphical data (from the ignition feedback module 234) to an operator of the generator 102. The textual and/or graphical data may be presented in a graph format such as the examples in FIGS. 5-8. In addition, as described further herein with reference to FIG. 3, the data interface 236 may provide a graphical data-input-form to receive a voltage value and a dwell time value for each of multiple data points to enable the ignition data generator 238 to create an ignition profile from the data points.

The ignition profile datastore 239 may store multiple ignition profiles that are converted by the ignition module 228 to control the power module 229. For example, the ignition module may produce drive control signals for switches in a switch mode amplifier (if the power module 229 includes a switch mode power supply) or a reference waveform for a linear amplifier (if the power module 229 includes a linear amplifier). In addition to ignition profiles that are programmed by an operator, the profile datastore may include one or more test profiles, and when executed, the ignition feedback module 234 may identify an ignition voltage when the test profile causes ignition. For example, the test profile may include data points that cause the waveform generator 230 to apply a changing voltage to the output until ignition occurs. Once ignition occurs, the operator will know what specific voltage prompted the ignition, and the operator can program and store an ignition profile based upon the specific voltage.

Figure 3:
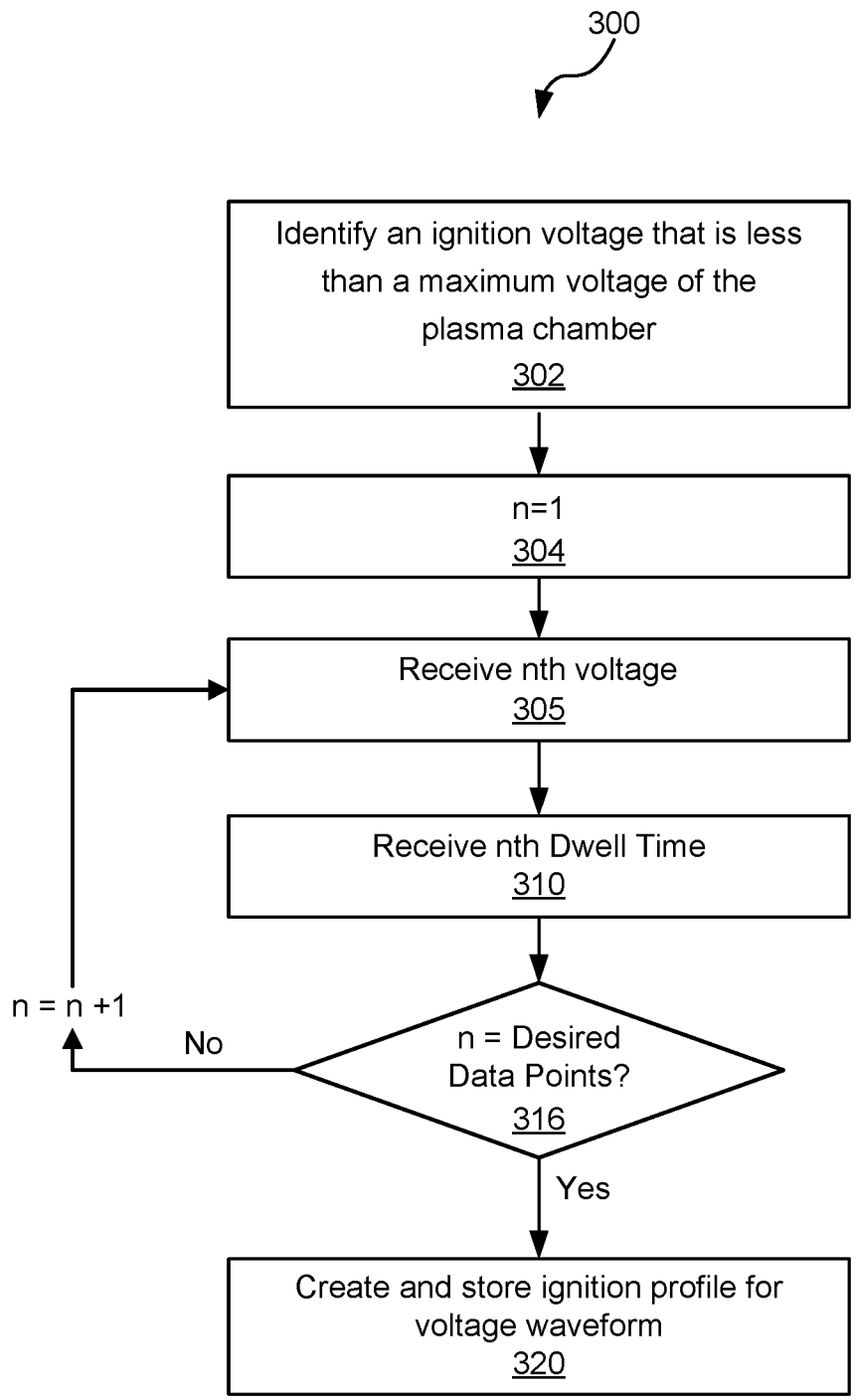
FIG. 3 is a flowchart depicting an exemplary method that may be traversed in connection with embodiments disclosed herein.

Referring next to FIG. 3, shown is a flowchart depicting an exemplary method 300 that may be carried out in connection with embodiments disclosed herein to program an ignition profile. The method 300 may be executed, for example, by the ignition feedback module 234 and the data interface 236 in connection with the ignition data generator 238, but it should be recognized that the method 300 may be executed instead by a different distribution of functional modules including fewer or more functional modules. More specifically, the method 300 may be encoded in processor executable instructions (organized in a variety of different functional modules) and stored in a non-transitory processor-readable medium (e.g., non-volatile memory), but it is contemplated that the method 300 may be executed entirely in hardware, which may also be divided into functional modules that do not visually appear to be divided in the same way as is depicted in FIG. 2.

In general, the method 300 produces an ignition profile that includes a voltage value and a time value for each of a desired number, N, of total data points. As an initial step, an ignition voltage may be identified that is less than a maximum voltage of the plasma chamber 105. For example, a test ignition profile may be executed by the waveform generator 230 and the ignition feedback module 234 may be used to identify the ignition voltage.

To produce an ignition profile, the data interface 236 may start by receiving, for a first data point (where n=1) (Block 304), a first voltage value (Block 305) and a first dwell time (Block 310). If n is not equal to the desired number, N, of total data points (Block 316), then n is incremented by one and an additional voltage-time pair for each value of n are obtained at Blocks 305-316 until n is equal to the desired number, N, of datapoints.

As shown in FIG. 3, an ignition profile, which includes the N data points, is created and stored (Block 320). Referring to FIG. 4 shown is an exemplary format of data for 1 ignition profiles. As shown, each ignition profile includes N data points representing voltages applied sequentially, and each data point incudes a voltage value and a dwell time value where each dwell time value defines how long each corresponding voltage value is maintained. Each ignition profile may correspond to a particular plasma chamber and/or particular conditions within a plasma chamber such as gas pressure, aspects of any magnetrons used, target material, and the type of workpiece being processed. As merely an example, the number, N, may be 100, but more or fewer data points may be used.

The potential range for a dwell time in each step may vary, but as an example, the range of dwell times may be from 1 millisecond to 10 milliseconds. It is also contemplated that the range may vary from tens of microseconds to hundreds of milliseconds, but these are just examples. The dwell time for each data point may also be fixed. For example, the dwell time in all of the data points may be fixed at 1 millisecond, and to achieve a dwell time longer than 1 millisecond, two or more sequential data points may have the same voltage value. The range of voltages in each data point that may be applied depends upon the type of power module 229 that is used, but typically the applied voltages are between zero volts and 1800 volts, and ignition voltages are typically between 1000 and 1800 volts.

Figure 6:
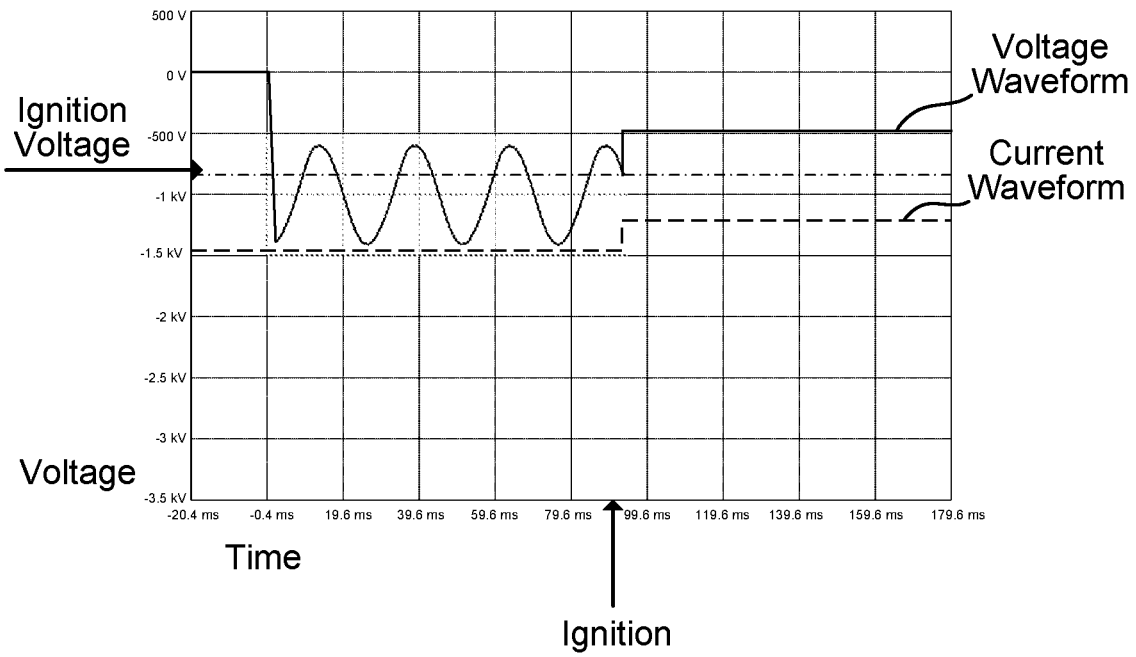
Figure 7:
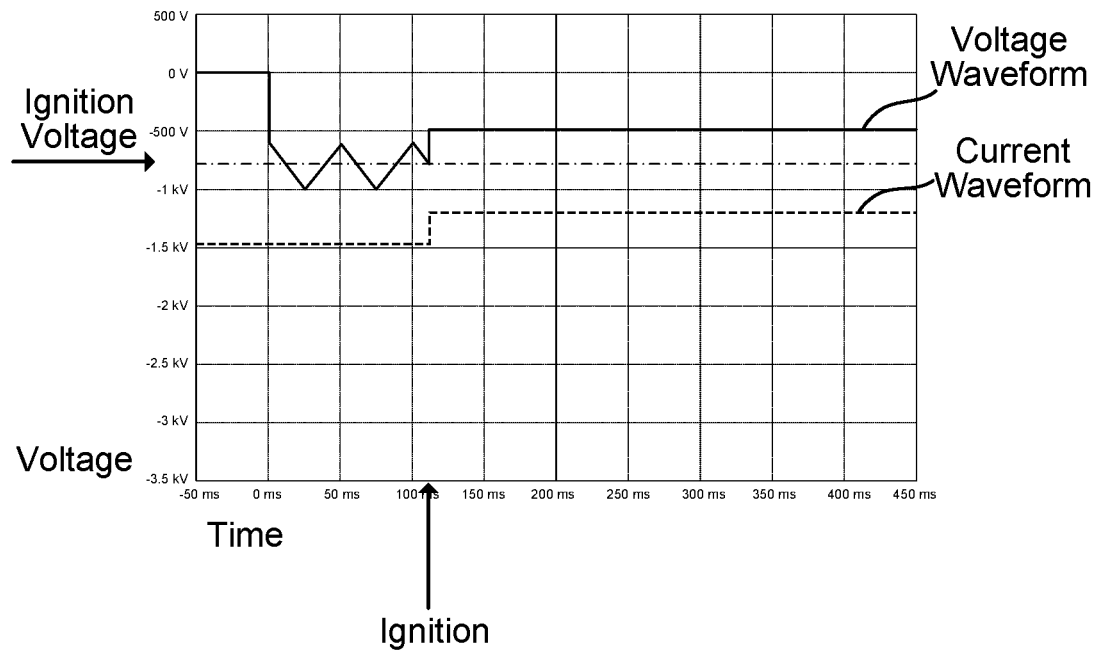
Figure 8:
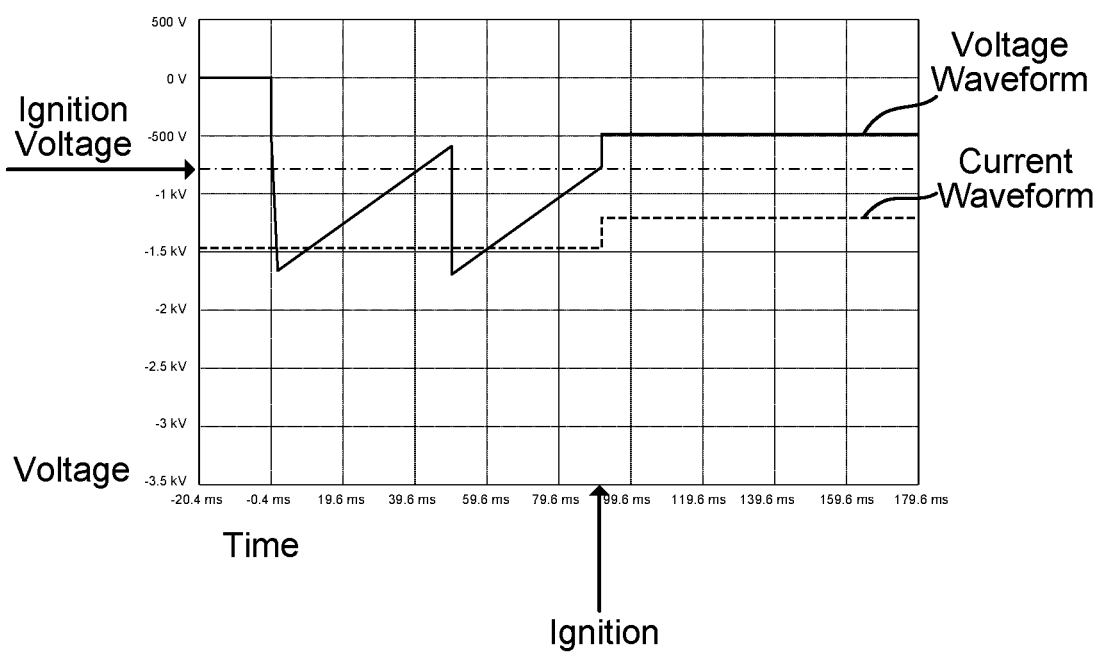

As discussed above, the particular voltage values and corresponding dwell times selected in the ignition profile may be based upon the identified ignition voltage (at Block 302). As an example, once the ignition voltage is identified, the ignition profile may be defined so that the voltage applied to the cathode jumps to the identified ignition voltage (or close to the identified voltage) and then dithers about the ignition voltage by alternating between decreasing below and increasing above the identified ignition voltage until ignition occurs. For example, the ignition profile may be defined so that the voltage applied to the cathode jumps to the identified ignition voltage (or close to the identified voltage) and then alternates plus or minus 20 volts above and below the identified ignition voltage until ignition occurs. As another example, the ignition profile may be defined so that the voltage applied to the cathode jumps to the identified ignition voltage (or close to the identified voltage) and then alternates plus or minus 10 volts above and below the identified ignition voltage until ignition occurs. Referring to FIGS. 6, 7, and 8, shown are exemplary ignition profiles that define voltages that vary about (above and below) an identified ignition voltage.

It is also contemplated that the data interface 236 may enable an operator to enter desired ignition profiles graphically (e.g., an operator may draw an ignition profile on a touch screen display) or define ignition profiles (in whole or in part) in terms of mathematical functions. For example, and operator may define two voltage values and a desired slope in terms of time (dv/dt). As another example, a user may provide an ignition voltage and a desired periodic voltage function, such as, without limitation, one or more of a sinusoidal, triangular, and/or sawtooth function. In these implementations, the data interface 236 in connection with the ignition data generator may produce and populate the particular values in each of the N data points of a generated ignition profile.

Some ignition profiles may be defined so that the voltage varies above and/or below an ignition voltage, but the voltage dwells longer at the ignition voltage. As merely an example, the voltages in an ignition profile may dwell at each voltage for a millisecond and then dwell at the ignition voltage for 10 milliseconds.

It is also contemplated that the method in FIG. 3 may be repeated many times to achieve a desired ignition profile. In some instances, the desired ignition profile may be consistent, repeatable ignition, and in other instances rapid plasma ignition is desired.

Figure 9:
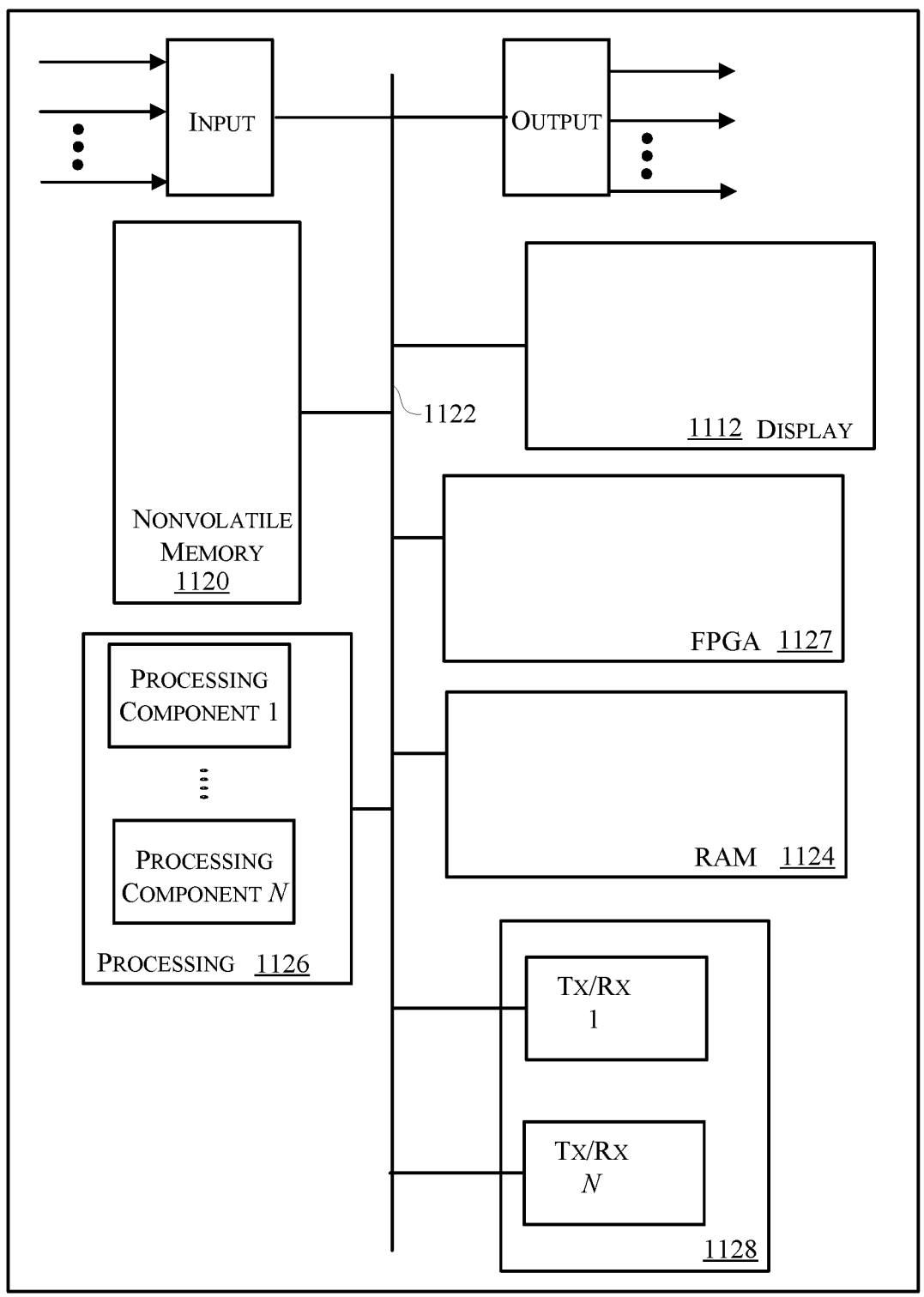
FIG. 9 depicts computing components that may be used in connection with embodiments disclosed herein.

The functions and methods described in connection with the embodiments disclosed herein may be effectuated utilizing hardware, in processor executable instructions encoded in non-transitory machine readable medium, or as a combination of the two. Referring to FIG. 9 for example, shown is a block diagram depicting physical components that may be utilized to realize aspects of the ignition profile generator 125. As shown, in this embodiment a display 1112 and nonvolatile memory 1120 are coupled to a bus 1122 that is also coupled to random access memory ("RAM") 1124, a processing portion (which includes N processing components) 1126, a field programmable gate array (FPGA) 1127, and a transceiver component 1128 that includes N transceivers. Although the components depicted in FIG. 9 represent physical components, FIG. 9 is not intended to be a detailed hardware diagram; thus, many of the components depicted in FIG. 9 may be realized by common constructs or distributed among additional physical components. Moreover, it is contemplated that other existing and yet-to-be developed physical components and architectures may be utilized to implement the functional components described with reference to FIG. 9.

The display 1112 generally operates to provide a user interface for a user, and in several implementations, the display 1112 is realized by a touchscreen display. For example, the display 1112 can be implemented as a part of the data interface 236 to enable an operator to view ignition-parameter values (e.g., to identify an ignition voltage), and if the display is a touchscreen display, the operator can enter the voltage and time values for the data points of the ignition profiles.

In general, the nonvolatile memory 1120 is non-transitory memory that functions to store (e.g., persistently store) data and machine readable (e.g., processor executable) code (including executable code that is associated with effectuating the methods described herein). In some embodiments, for example, the nonvolatile memory 1120 includes bootloader code, operating system code, file system code, and non-transitory processor-executable code to facilitate the execution of the methods described with reference to FIG. 3 described above. The nonvolatile memory 1120 may also be used to realize the profile datastore 239.

In many implementations, the nonvolatile memory 1120 is realized by flash memory (e.g., NAND or ONENAND memory), but it is contemplated that other memory types may also be utilized. Although it may be possible to execute the code from the nonvolatile memory 1120, the executable code in the nonvolatile memory is typically loaded into RAM 1124 and executed by one or more of the N processing components in the processing portion 1126.

In operation, the N processing components in connection with RAM 1124 may generally operate to execute the instructions stored in nonvolatile memory 1120 to realize the functionality of the generator 102, 202. For example, non-transitory processor-executable instructions (to effectuate the functions of the ignition feedback module 234, the data interface 236, and the ignition data generator) may be persistently stored in nonvolatile memory 1120 and executed by the N processing components in connection with RAM 1124. As one of ordinary skill in the art will appreciate, the processing portion 1126 may include a video processor, digital signal processor (DSP), graphics processing unit (GPU), and other processing components.

In addition, or in the alternative, the field programmable gate array (FPGA) 1127 may be configured to effectuate one or more aspects of the functions and methodologies described herein. For example, non-transitory FPGA-configuration-instructions may be persistently stored in non-volatile memory 1120 and accessed by the FPGA 1127 (e.g., during boot up) to configure the FPGA 1127 to effectuate the functions of the ignition profile generator 225.

The input component may operate to receive signals (e.g., from sensor 232) that are indicative of one or more properties of the power that is output by the waveform generator and/or the plasma load in plasma processing chamber 105. The signals received at the input component may include, for example, voltage, current, forward power, reflected power, and plasma load impedance. The output component generally operates to provide one or more analog or digital signals to effectuate an operational aspect of the generator 102, 202. For example, the output portion may transmit a signal indicative of a controlled parameter (such as voltage and/or frequency) to the waveform generator 230.

The depicted transceiver component 1128 includes N transceiver chains, which may be used for communicating with external devices via wireless or wireline networks. Each of the N transceiver chains may represent a transceiver associated with a particular communication scheme (e.g., WiFi, Ethernet, Profibus, etc.). The transceiver component 1128 may be implemented as a part of the data interface 236 to provide network connectivity to the generator 102, 202. The network connectivity enables an operator to view information from the ignition feedback module 234 and provide ignition data to the ignition data generator 238 from a remote location (e.g., from a remotely located computer).

The previous description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

What is claimed is:

1. A generator for igniting a plasma in a plasma chamber, the generator comprising:
   an ignition profile generator comprising:
      a data interface configured to receive a voltage value and a time value for each of N data points;
      an ignition data generator configured to create an ignition profile from the N data points;
      an ignition profile datastore to store the ignition profile wherein the ignition profile datastore includes at least one test profile, and the ignition profile generator includes an ignition feedback module to identify an ignition voltage when the at least one test profile causes ignition; and
   a waveform generator configured to apply a waveform with the ignition profile to an output of the generator.

2. The generator of claim 1, wherein the at least one test profile includes data points that cause the waveform generator to apply a changing voltage to the output until ignition occurs.

3. The generator of claim 1, wherein the waveform generator includes one of a linear amplifier or a switch-mode amplifier.

4. A generator for igniting a plasma in a plasma chamber, the generator comprising:
   a waveform generator configured to produce and apply voltage waveforms at an output of the generator; and
   an ignition profile generator configured to:
      identify an ignition voltage that is less than a maximum voltage of the plasma chamber;
      create an ignition profile based upon the ignition voltage using N data points, each of the N data points including a voltage value and a time value; and
      store the ignition profile in an ignition profile datastore for use by the waveform generator, wherein the ignition profile datastore includes at least one test profile, and the ignition profile generator includes an ignition feedback module to identify the ignition voltage when the at least one test profile causes ignition.

5. The generator of claim 4, wherein the at least one test profile includes data points that cause the waveform generator to apply a changing voltage to the output until ignition occurs.

6. The generator of claim 4, wherein the waveform generator includes one of a linear amplifier or a switch-mode amplifier.

7. A non-transitory processor-readable medium encoded with instructions for igniting a plasma in a plasma chamber with a generator, the instructions including instructions to:
   receive a voltage value and a time value for each of N data points;
   create an ignition profile from the N data points, wherein the instructions to create the ignition profile include instructions to receive a voltage value and a time value for each of the N data points to create the ignition profile so that a resulting ignition waveform jumps to an ignition voltage and then dithers about the ignition voltage;
   store the ignition profile in an ignition profile datastore; and
   apply a waveform with the ignition profile to an output of the generator.

8. The non-transitory processor-readable medium of claim 7, including instructions to:
   apply a changing voltage with the generator to the output to identify an ignition voltage that is less than a maximum voltage of the generator.

9. The non-transitory processor-readable medium of claim 7, wherein the instructions to receive a voltage value and a time value for each of N data points include instructions to receive the voltage value and the time value for each of N data points from an operator of the generator.

10. The non-transitory processor-readable medium of claim 7, wherein the instructions to receive a voltage value and a time value for each of N data points includes instructions to generate the voltage value and the time value for each of N data points.

* * * * *